United States Patent

Bogner et al.

(10) Patent No.: US 10,309,989 B2
(45) Date of Patent: Jun. 4, 2019

(54) MEASUREMENT APPARATUS

(71) Applicant: Infineon Technologies AG, Neubiberg (DE)

(72) Inventors: Peter Bogner, Wernberg (AT); Franz Kuttner, St. Ulrich (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/728,257

(22) Filed: Oct. 9, 2017

(65) Prior Publication Data

US 2018/0031610 A1 Feb. 1, 2018

Related U.S. Application Data

(63) Continuation of application No. 12/761,017, filed on Apr. 15, 2010, now abandoned.

(51) Int. Cl.
*G01R 15/06* (2006.01)

(52) U.S. Cl.
CPC .................... *G01R 15/06* (2013.01)

(58) Field of Classification Search
CPC ...................................... G01R 15/06
See application file for complete search history.

(56) References Cited

U.S. PATENT DOCUMENTS

| | | | | |
|---|---|---|---|---|
| 4,852,130 A | * | 7/1989 | Draxelmayr | H03M 1/462 341/155 |
| 5,790,063 A | * | 8/1998 | Koifman | H03M 3/348 341/155 |
| 5,852,415 A | * | 12/1998 | Cotter | H03M 1/1028 341/120 |
| 6,304,206 B1 | | 10/2001 | Wada et al. | |
| 6,307,497 B1 | | 10/2001 | Leung et al. | |
| 6,337,647 B1 | | 1/2002 | Masson et al. | |
| 6,366,098 B1 | | 4/2002 | Froment | |
| 6,445,331 B1 | * | 9/2002 | Stegers | G06G 7/1865 327/337 |
| 6,839,009 B1 | * | 1/2005 | Ali | H03M 1/1004 341/118 |
| 6,891,487 B2 | * | 5/2005 | Leung | H03M 1/1057 341/120 |
| 6,940,445 B2 | * | 9/2005 | Kearney | H03M 1/129 341/144 |
| 7,023,372 B1 | | 4/2006 | Singh et al. | |
| 7,473,955 B1 | | 1/2009 | Heshami et al. | |
| 7,492,296 B1 | * | 2/2009 | Drakshapalli | H03M 3/35 341/122 |
| 2003/0063026 A1 | | 4/2003 | Nandy | |
| 2003/0117308 A1 | | 6/2003 | Kawahito et al. | |
| 2004/0061637 A1 | | 4/2004 | Fujimoto | |

(Continued)

OTHER PUBLICATIONS

Prosecution History from U.S. Appl. No. 12/761,017, dated from Sep. 27, 2012 through May 24, 2017, 196 pp.

*Primary Examiner* — Patrick Assouad
*Assistant Examiner* — Haidong Zhang
(74) *Attorney, Agent, or Firm* — Shumaker & Seiffert, P.A.

(57) ABSTRACT

Measurement apparatuses and methods are described. A measurement input is coupled with a first terminal of a capacitance via a first switch, and a reference voltage is coupled with the first terminal of the capacitance via a second switch. A measurement circuit is coupled to a second terminal of said capacitance.

20 Claims, 2 Drawing Sheets

(56) References Cited

U.S. PATENT DOCUMENTS

| | | | |
|---|---|---|---|
| 2005/0024250 A1* | 2/2005 | Atriss | H03M 1/0695 |
| | | | 341/163 |
| 2006/0202879 A1 | 9/2006 | Aksin et al. | |
| 2009/0033293 A1 | 2/2009 | Xing et al. | |
| 2010/0026546 A1 | 2/2010 | Ohnhaeuser et al. | |
| 2011/0110011 A1 | 5/2011 | Dittfeld et al. | |
| 2011/0254569 A1 | 10/2011 | Bogner et al. | |

* cited by examiner

MEASUREMENT APPARATUS

CROSS-REFERENCE TO RELATED APPLICATION

The present application is a continuation of U.S. Nonprovisional patent application Ser. No. 12/761,017, filed 15 Apr. 2010 and entitled MEASUREMENT APPARATUS.

BACKGROUND

The present invention relates to measurement apparatuses and measurement methods.

In some applications, for example automotive applications, voltages are to be measured using semiconductor circuits, such semiconductor circuits for example being designed to convert the measured voltage to a digital value. Such voltages may for example be in the range of up to 50 V in some automotive applications. On the other hand, digital circuits manufactured by using standard CMOS processes are often designed for much lower voltages, for example a voltage of 5 V or 1.5 V as maximum voltage.

In order to be able to process a high input voltage with standard semiconductor devices, sometimes resistive dividers are used to reduce a high input voltage to a voltage range up to 5 V which then is processed by a semiconductor circuit, for example converted to a digital value for further processing. However, the use of a resistive divider provides challenges regarding its accuracy and furthermore depending on the implementation may consume a significant area on a semiconductor chip or in a device.

Figure 1:
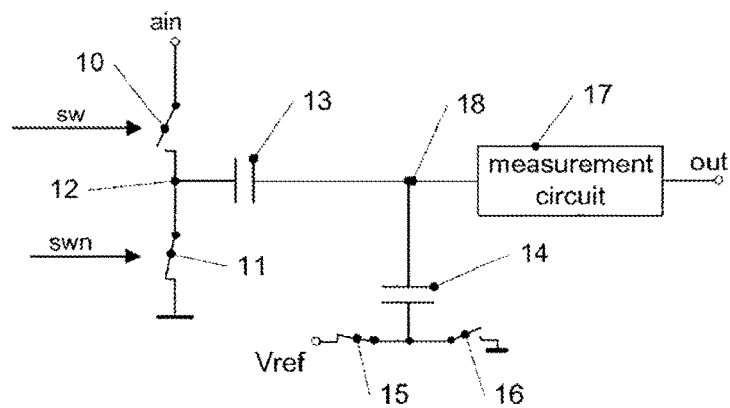
FIG. 1 illustrates an apparatus according to an embodiment.

In the following, some embodiments of the present invention will be described in detail. It is to be understood that the following description is given only for the purpose of illustration and is not to be taken in a limiting sense. The scope of the invention is not intended to be limited by the embodiments described hereinafter with reference to the accompanying drawings, but is intended to be limited only by the appended claims and equivalents thereof.

It is also to be understood that in the following description of the embodiments any direct connection or coupling between functional blocks, devices, components, circuit elements or other physical or functional units shown in the drawings or described herein could also be implemented by an indirect connection or coupling, i.e. a connection or coupling comprising one or more intervening elements. Furthermore, it should be appreciated that functional blocks or units shown in the drawings may be implemented as separate circuits in some embodiments, but may also be fully or partially implemented in a common circuit in other embodiments. On the other hand, a single functional block may also be implemented using a plurality of separate circuits.

It should be noted that the drawings are provided to give an illustration of some aspects of embodiments of the present invention and are therefore to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative location of the various components and implementations according to an embodiment of the invention.

The features of the various embodiments described herein may be combined with each other unless specifically noted otherwise. On the other hand, describing an embodiment with a plurality of features is not to be construed as indicating that all those features are necessary for practicing the present invention, as other embodiments may comprise less features and/or alternative features.

Some of the embodiments relate to measurement apparatuses and devices. Measurement in the context of this application is intended to be understood as any capturing of a physical quantity, for example a current or a voltage, and converting the captured quantity to a signal, for example a digital signal, which may then be further processed.

In an embodiment, an apparatus is provided. A node is coupled with a measurement input via a first switch and with a reference potential via a second switch. The node is further coupled with a first terminal of a capacitance. A second terminal of the capacitance is coupled with a measurement circuit.

In such an embodiment, the first switch and the second switch may be controlled to switch periodically such that always one of the switches is closed and the other one of the switches is opened. In this way, for example a voltage applied to the measurement input may be reduced such that the measurement circuit may be implemented with a technology adapted to lower voltages than voltages applied to the measurement input.

In some embodiments, the apparatus may further comprise one or more switchable capacitances. A first terminal of each of the one or more switchable capacitances may be coupled with a node between said second terminal of the capacitance and the measurement circuit, and second terminal of the one or more switchable capacitances are individually switchable between being connected to a first reference voltage and a second reference voltage, for example a band gap reference voltage and ground.

The measurement circuit in some embodiments may comprise a comparator and/or a successive approximation register to provide an analog-to-digital conversion of a signal applied to the measurement input.

Further embodiments will now be described with reference to the Figures. Some of these embodiments further illustrate some of the features set forth above.

In FIG. 1, an embodiment of an apparatus is shown. In the embodiment of FIG. 1, a first switch 10 couples a measurement input where a signal ain, for example a voltage signal, to be measured is applied, with a node 12. Signal ain may be a voltage signal with a comparatively high voltage, for example up to 10 V, up to 20 V or up to 50 V. In some implementations, ain may be a voltage related to automotive and/or safety applications. For example, ain may be a voltage at a capacitance used as an emergency power supply for an airbag device. A second switch 11 couples node 12 with ground. In the embodiment of FIG. 1, first switch 10 is controlled by a signal sw and second switch 11 is controlled by a signal swn. First switch 10, second switch 11 and signals sw, swn may be selected such that when one of the switches 10, 11 is closed (i.e. conducting between its terminals), the other one of switches 10, 11 is open (i.e. non-conducting between its terminals). For example, switches 10 and 11 may be of the same type, and swn may be the inverse of the signal sw. In another embodiment, switches 10, 11 may be selected to respond in an opposite manner to the respective control signal (for example switch 10 may be closed when the control signal is high and be open when the control signal is low, and switch 11 may react the other way round), and signals sw, swn may be identical in such an embodiment.

Switches 10, 11 may be switched with a predetermined duty cycle periodically, i.e. within each period switch 10 is closed for a predetermined portion of each period and switch 11 is closed for the remaining portion of each period.

Node 12 is coupled with a first terminal of a capacitance 13. A second terminal of capacitance 13 is coupled with a measurement circuit 17. Measurement circuit 17 may comprise elements like a buffer, an analog-to-digital converter and/or an integrator. An output signal out is output from the measurement circuit for further processing. In case measurement circuit 17 comprises an analog-to-digital converter, signal out may be a digital signal.

Optionally, a node 18 between the second terminal of capacitance 13 and measurement circuit 17 is coupled with a first input of a further capacitance 14. A second terminal of further capacitance 14 is selectively coupled via switches 15, 16 either with a reference voltage Vref or with ground. Instead of ground, a further reference voltage below Vref may be provided. Switches 15, 16 are controlled such that when one of the switches is open, the other one of the switches is closed. This control may for example be performed by measurement circuit 17. In this way, further capacitance 14 together with capacitance 13 may serve as sampling capacitance of a capacitance-based digital-to-analog converter for example to provide a feedback of the digital output signal out or any other signal in measurement circuit 17 to node 18. It should be noted that while a single further capacitance 14 is shown in FIG. 1, in other embodiments more than one further capacitance with associated switches may be provided.

In the embodiment of FIG. 1, switches 10, 11 and capacitance 13 may be designed to tolerate voltages in a voltage range corresponding to a possible voltage range of signal ain, while measurement circuit 17, capacitance 14 and switches 15, 16 may be implemented using a technology tolerant only to smaller voltages. For example, elements 14 to 17 may be implemented using a 1.5 V or a 5 V CMOS technology, while switches 10, 11 and capacitance 13 may be implemented to be tolerant for example to voltages up to 50 V.

For example, capacitances 13,14 may be used for implementing a successive approximation analog-to-digital converter in measurement circuit 17. An example for such an implementation will next be discussed with reference to FIG. 2.

Figure 2:
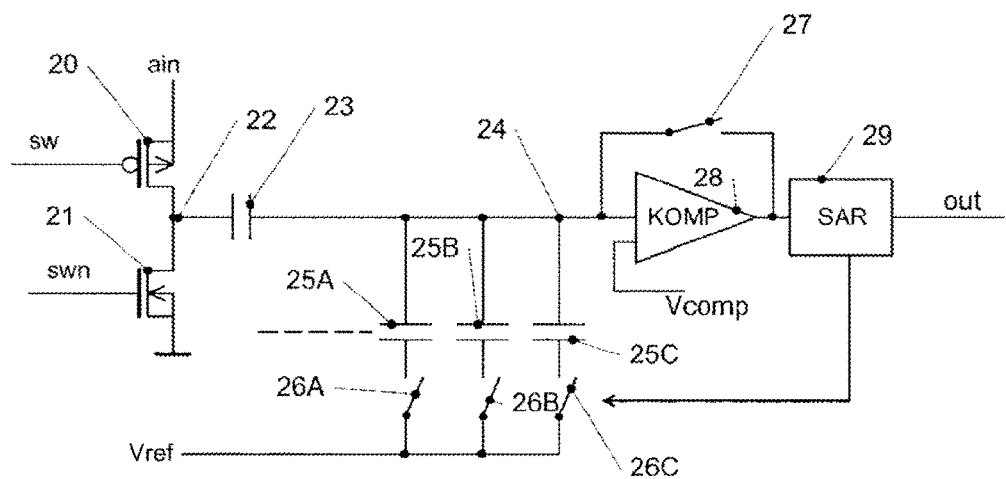
FIG. 2 illustrates an apparatus according to a further embodiment.

In the embodiment of FIG. 2, a signal input where a signal ain to be measured may be applied is coupled with a node 22 via a first switch, which in the embodiment of FIG. 2 is implemented as a PMOS transistor 20. Furthermore, node 22 is coupled with ground via a second switch, which in case of FIG. 2 is implemented as an NMOS transistor 21. It should be noted that instead of MOS transistors, the first switch and the second switch may e.g. also be implemented using other kinds of transistors like CMOS or bipolar transistors. In other embodiments, the first switch and/or the second switch may comprise more than one element, e.g. transistors of different types. For example, the first switch and/or the second switch may comprise a transmission gate. In the embodiment of FIG. 2, a signal sw is fed to a base terminal of PMOS transistor 20, and a signal swn is fed to an NMOS transistor 21. In this case, signals sw and swn may be identical such that when the first switch is closed (i.e. PMOS transistor 20 is conducting between its source and drain terminals), the second switch is open (i.e. NMOS transistor 21 is essentially non-conducting between its source and drain terminals) and vice versa. In other embodiments, for example both the first switch and the second switch may be implemented as a PMOS transistor or both may be implemented as an NMOS transistor, and in such an embodiment signal swn may be the inverse of signal sw, such that also when one of the switches is open, the other one is closed.

Node 22 is coupled with a first terminal of a capacitance 23. A second terminal of capacitance 23 is coupled with a first input of a comparator 28.

In addition, a node 24 between the second terminal of capacitance 23 and comparator 28 is coupled with an array of capacitances 25A, 25B, 25C, all capacitances being collectively referred to as capacitances 25. While three capacitances 25 are shown in the embodiment of FIG. 2, the number of capacitances 25 is not limited to any particular number and may for example be selected based on a number of bits of a digital output signal out which will be described further below.

Each of capacitances 25 is coupled with a first terminal of a respective switch 26, i.e. a second terminal of capacitance 25A is coupled with a first terminal of a switch 26A, a second terminal of capacitance 25B is coupled with a first terminal of a switch 26B and a second terminal of capacitance 25C is coupled with a first terminal of a switch 26C. A second terminal of each of switches 26 is coupled with a reference voltage Vref which may for example be a band gap reference voltage, for example 1.23 V in case of the silicon band gap used as a reference. It should be noted that while switches 26 are shown to couple second terminals of capacitances 25 selectively with the reference voltage Vref, switches 26 may be designed to selectively couple the second terminals of capacitances 25 either with the reference voltage Vref or with a further reference voltage, for example ground or a negative reference voltage, similar to what has been shown with respect to FIG. 1 for capacitance 14. An output of comparator 28 is coupled with an successive approximation register 29, which outputs the digital output signal out. Successive approximation register 29 furthermore controls switches 26.

A second input of comparator 28 is coupled with a reference voltage Vcomp, for example ground or a positive reference voltage. In some embodiments, Vcomp may be a fully differential voltage. An output of comparator 28 is coupled with the first input of comparator 28 via a switch 27, which switch 27 also may be controlled by successive approximation register 29.

In the embodiment of FIG. 2, PMOS transistor 20, NMOS transistor 21 and capacitance 23 may be designed to tolerate voltages corresponding to a voltage range of input signal ain, for example voltages of up to 50 V. On the other hand, elements like capacitances 25, switches 26, switch 27, comparator 28 and/or successive approximation register 29 may be implemented or designed for tolerating a smaller voltage, for example may be designed as standard 1.5 V digital devices or standard 5 V digital devices.

In operation of the embodiment of FIG. 2, signals sw, swn may control PMOS transistor 20 and NMOS transistor 21 to open and close periodically with a predetermined duty cycle, i.e. within each period PMOS transistor 20 is conducting between source and drain terminals for a part of the period and NMOS transistor 21 is conducting for the other part of the period. The ratio between the times where the two transistors are conducting may be selected based on a voltage range of signal ain and on a voltage tolerance of elements 25 to 29.

Comparator 28, successive approximation register 29, capacitance 23 and capacitances 25 together with switches 26 act as a successive approximation register (SAR)-Analog-to-Digital Converter (ADC), wherein capacitances 23 and 25 together with switches 26 form a capacitive Digital-to-Analog Converter (DAC). In particular, switches 26 and 27 are controlled to periodically sample the input signal applied via capacitance 23 capacitances 25 may be used to determine values for different bits of output signal out by for example closing only the switch associated with a capacitance 25 which in turn is associated with a certain bit and then decide on the value of the respective bit base on the output of comparator 28.

While FIG. 2 shows an implementation using a SAR-ADC to generate a digital output signal out, in other embodiments other types of analog-to-digital converters may be used.

Capacitance values of capacitances 25 may be selected to have ratios approximately according to 1:2:4:8 . . . , i.e. be binary weighted. For example the capacitance value of capacitance 25B may be essentially twice the capacitance value of capacitance 25C, and the capacitance value of capacitance 25A may be essentially twice the value of the capacitance value of capacitance 25B, corresponding to the values of bits associated with the respective capacitance (the capacitance with the lowest value being associated with the least significant bit and the capacitance with the highest capacitance value being associated with the most significant bit). In other implementations, the capacitance values may be unary weighted, i.e. may nominally have equal values.

In some embodiments, a capacitance value of capacitance 23 may be matched to the capacitance values of capacitances 25. For example, in case of unary weighting the capacitance value of capacitance 23 may nominally be the same as the capacitance values of capacitances 25, or in case of binary weighting the capacitance value of capacitance 23 may be part of the binary weighting, e.g. by having twice the capacitance value of the largest capacitance 25 or half the capacitance value of the smallest capacitance 25. Such a selection is useful in embodiments as described above where capacitance 23 is also used as a capacitance of the capacitive DAC.

Figure 3:
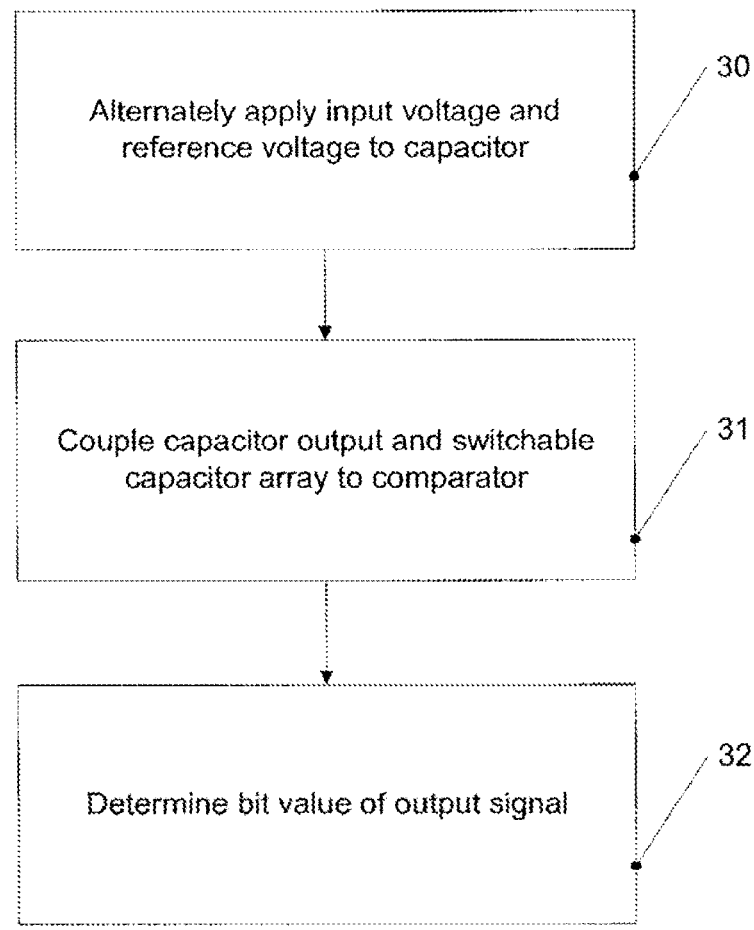
FIG. 3 illustrates a method according to an embodiment.

In FIG. 3, a method according to an embodiment is shown. The method of FIG. 3 may for example be implemented in the apparatuses of FIG. 1 or FIG. 2, but may also be implemented independently therefrom.

At 30, an input voltage to be measured and a reference voltage, for example ground, are alternately applied to an input of a capacitor. At 31, an output of the capacitor and a switchable capacitor array is coupled to a comparator input. Switchable capacitor array may be switched to sample a signal with different capacitors activated to determine different bit values.

At 32, a bit value of an output signal is determined based on an output of the comparator.

The above embodiments serve only as some examples how to implement the present invention and are therefore not to be construed as limiting the scope thereof.

What is claimed is:

1. A device, comprising:
an input portion consisting of a first switch and a second switch;
wherein the first switch is coupled between a measurement input and a first node, and
wherein the second switch is coupled between said first node and a reference voltage node at a first reference voltage,
a capacitance, wherein a first terminal of said capacitance is coupled with said first node, and a second terminal of said capacitance is coupled with a second node, and
a measurement circuit that comprises second-voltage-rated components only, wherein a terminal of said measurement circuit is coupled to the second node, wherein said first switch, said second switch and said capacitance are first-voltage rated components, wherein the first-voltage rated components are designed to tolerate a first voltage magnitude of greater than five volts and wherein the second-voltage rated components are designed to tolerate a second non-zero voltage magnitude smaller than said first voltage magnitude.

2. The apparatus of claim 1, further comprising at least one switchable further capacitance, wherein a first terminal of said at least one switchable further capacitance is coupled with the second node between said second terminal of said capacitance and said measurement circuit.

3. The apparatus of claim 2, wherein a second terminal of said at least one switchable further capacitance is switchably coupled with either a second reference voltage or a third reference voltage.

4. The apparatus of claim 2, wherein said at least further switchable capacitance forms part of a capacitive digital-to-analog converter.

5. The apparatus of claim 2, wherein said at least one switchable capacitance comprises a plurality of switchable further capacitances, said further capacitances having binary weighted capacitance values.

6. The apparatus of claim 2, wherein said at least one switchable capacitance comprises a plurality of switchable further capacitances, said further capacitances having nominally equal values.

7. The circuit of claim 1, wherein said first switch comprises a PMOS transistor and said second switch comprises an NMOS transistor.

8. The apparatus of claim 1, wherein said measurement circuit comprises at least one of a buffer, an integrator and an analog-to-digital converter.

9. An apparatus, comprising:
a first capacitance,
an input portion consisting of a first switch and a second switch,
a voltage input coupled with a first terminal of said first capacitance via said first switch,
a reference voltage node at a first reference voltage coupled to said first terminal of said first capacitance via said second switch,
a comparator, wherein a first input of said comparator is coupled with a second terminal of said first capacitance,
a successive approximation register that is coupled with an output of said comparator, and
an array of second capacitances, wherein each one capacitance of said array of second capacitances has a first terminal that is coupled with said first input of said comparator and a second terminal that is selectively coupled with a further reference voltage node, wherein said first switch, said second switch and said first capacitance are first-voltage rated components designed to tolerate a first voltage magnitude of greater than five volts, wherein said comparator, said successive approximation register and each capacitance of said array of second capacitances are second-voltage rated components, and wherein the second-voltage rated components are designed to tolerate a second non-zero voltage magnitude smaller than said first voltage magnitude.

10. The apparatus of claim 9, wherein said second terminal of each of said second capacitances is configured to be coupled with a second reference voltage or a third reference voltage at the further reference voltage node.

11. The apparatus of claim 9, further comprising an array of switches, each switch of said array of switches being coupled with one of said second terminal of said second capacitances to perform said selective coupling.

12. The apparatus of claim 11, wherein said array of switches is controlled by said successive approximation register.

13. The apparatus of claim 9, wherein a second input of said comparator is configured to be coupled with a fourth reference voltage.

14. The apparatus of claim 9, wherein said output of said comparator is coupled with said first input of said comparator via a third switch.

15. The apparatus of claim 9, wherein said first switch and said second switch are controllable such that when one of said first switch and said second switch is closed, the other one of said first switch and said second switch is open.

16. The apparatus of claim 9, wherein said first switch and said second switch comprise a MOS transistor or a bipolar transistor.

17. The apparatus of claim 9, wherein a capacitance value of said first capacitance is matched with each capacitance value of said second capacitances.

18. A method, comprising:

alternately applying an input voltage and a first reference voltage to a first input of a capacitor via an input portion of a device, wherein the input portion consists of a first switch and a second switch, such that the first switch is coupled between the input voltage and the first input of the capacitor and the second switch is coupled between the first reference voltage and the first input of the capacitor, coupling a second terminal of said capacitor to a comparator, and determining a bit value of an output signal based on an output of said comparator, wherein said first switch, said second switch and said capacitance are first-voltage rated components designed to tolerate a first voltage magnitude of greater than five volts, wherein said comparator is a second-voltage rated component, and wherein the second-voltage rated component is designed to tolerate a second non-zero voltage magnitude smaller than said first voltage magnitude.

19. The method of claim 18, further comprising selectively coupling second terminals of further capacitances of a capacitance array either with a second reference voltage or a third reference voltage, wherein first terminals of said further capacitances being coupled to said comparator.

20. The method of claim 19, further comprising coupling an output of said comparator to an input of said comparator.

* * * * *